United States Patent [19]

Leibowitz

[11] Patent Number: 4,875,282
[45] Date of Patent: Oct. 24, 1989

[54] METHOD OF MAKING MULTILAYER PRINTED CIRCUIT BOARD

[75] Inventor: Joseph D. Leibowitz, Culver City, Calif.

[73] Assignee: TRW Inc., Redondo Beach, Calif.

[21] Appl. No.: 268,127

[22] Filed: Nov. 7, 1988

Related U.S. Application Data

[62] Division of Ser. No. 98,260, Sep. 18, 1987, Pat. No. 4,814,945.

[51] Int. Cl.$^4$ .............................................. H05K 3/36
[52] U.S. Cl. .................................. 29/830; 156/307.5; 174/68.5
[58] Field of Search .................... 29/830, 846, 852; 174/68.5; 156/307.1, 307.3, 307.5

[56] References Cited

U.S. PATENT DOCUMENTS

| | | |
|---|---|---|
| 3,526,565 | 9/1970 | Walter . |
| 3,686,048 | 8/1972 | Sehirtzinger . |
| 4,282,011 | 8/1981 | Terpay . |
| 4,318,954 | 3/1982 | Jensen . |
| 4,368,234 | 1/1983 | Palmer et al. . |
| 4,410,577 | 10/1983 | Palmer et al. . |
| 4,414,264 | 11/1983 | Olson . |
| 4,496,793 | 1/1985 | Hanson et al. ................... 29/830 X |
| 4,513,055 | 4/1985 | Leibowitz . |
| 4,522,667 | 6/1985 | Hanson et al. . |
| 4,536,438 | 8/1985 | Bishop et al. . |
| 4,569,692 | 2/1986 | Butt . |
| 4,576,857 | 3/1986 | Gannett et al. . |
| 4,579,107 | 3/1986 | Ferrari . |
| 4,582,748 | 4/1986 | Eastes et al. . |
| 4,590,539 | 5/1986 | Sanjana et al. . |
| 4,591,659 | 5/1986 | Leibowitz . |
| 4,609,586 | 9/1986 | Jenson et al. . |
| 4,614,559 | 9/1986 | Shirasawa et al. ................ 29/830 X |
| 4,623,577 | 11/1986 | Hsiue et al. . |

FOREIGN PATENT DOCUMENTS 3240754 5/1983 Fed. Rep. of Germany ........ 29/830

OTHER PUBLICATIONS

IBM Tech. Discl. Bull., vol. 27, No. 8, Jan. 1985, pp. 4841-4842 by Pohl et al. (29/830).

Primary Examiner—Howard N. Goldberg
Assistant Examiner—Carl J. Arbes
Attorney, Agent, or Firm—James M. Steinberger; Sol L. Goldstein

[57] ABSTRACT

A multilayer printed circuit board in which multiple layers of a composite material, fabricated by the lay-up of an aramid fiber tape, are employed to provide a circuit board with a desired coefficient of thermal expansion. Tape lay-up of aramid fibers provides a composite layer having a lower thermal coefficient of expansion than a composite layer fabricated from woven aramid fibers. Degradation in the tensile modulus of elasticity caused by the over and under characteristics of woven fabrics is also eliminated by tape lay-up, thus providing a circuit board with better mechanical strength. In addition, tape lay-up reduces the amount of resin required to fabricate the circuit board and eliminates the need for twisting the aramid fibers into yarns and then weaving the yarns, thus reducing the cost of the circuit board.

16 Claims, 1 Drawing Sheet

METHOD OF MAKING MULTILAYER PRINTED CIRCUIT BOARD

This is a divisional of application Ser. No. 098,260 filed 09/18/87, now U.S. Pat. No. 4,814,845.

BACKGROUND OF THE INVENTION

This invention relates generally to multilayer printed circuit boards and, more particularly, to multilayer printed circuit boards having coefficients of thermal expansion that approximate that of the electronic components to be mounted on the circuit boards.

Multilayer printed circuit boards are widely used for interconnecting large numbers of integrated-circuit (IC) chips. The IC chips are usually hermetically sealed in individual chip carriers fabricated from a ceramic material, such as aluminum oxide. Bonded leads are brought out from each IC chip to the edges of the chip carrier, and the chip carrier is then soldered directly to the circuit board. The principal advantages of this structure are significantly higher circuit densities, improved speed and impedance characteristics, and substantially reduced packaging costs.

A major drawback of using ceramic chip carriers is that the coefficient of thermal expansion of aluminum oxide is approximately one-half the coefficient of thermal expansion of the glass/epoxy laminates that are typically used in the manufacture of multilayer printed circuit boards (5.5 to $6 \times 10^{-6}$ in/in/°C. for aluminum oxide compared with 12 to $15 \times 10^{-6}$ in/in/°C. for glass/epoxy). When the resulting structure is exposed to any significant range of temperatures, the thermal cycling of the structure can crack soldered joints and render the circuit inoperative. One solution to this problem is to use an intermediate member between the chip carrier and the circuit board. The intermediate member is sometimes referred to as a baby board and the circuit board as a mother board. The intermediate member may also take the form of a hybrid package on which the chip carrier is mounted.

Another solution to the thermal mismatch between a ceramic chip carrier and a multilayer printed circuit board is to tailor the coefficient of thermal expansion of the circuit board to that of the chip carrier. One technique for matching the two coefficients of thermal expansion is to bond the circuit board to the surface of a graphite support member, as disclosed in U.S. Pat. No. 4,318,954 to Jensen and U.S. Pat. No. 4,609,586 to Jensen et al. The graphite support member has a coefficient of thermal expansion that is approximately zero and when a conventional circuit board is bonded to the support member, the coefficient of thermal expansion of the circuit board is reduced to about that of a ceramic chip carrier.

Another technique for matching the coefficient of thermal expansion of a ceramic chip carrier to that of a multilayer printed circuit board is to fabricate the multilayer circuit board from multiple layers of a dielectric material interleaved with multiple layers of graphite, as disclosed in U.S. Pat. No. 4,591,659 to the present inventor. Some of the layers of dielectric material are copper-clad layers having etched electrical patterns for electrically interconnecting the IC chips. The layers of graphite reduce the coefficient of thermal expansion of the copper patterns and the dielectric material, and the layers of graphite are spaced symmetrically across the circuit board to minimize bending of the board during temperature changes. Some of the layers of graphite are positioned in close proximity to the layers of copper-clad dielectric material in order to conduct heat away from the IC chips.

A similar technique for matching the coefficients of thermal expansion is to fabricate the multilayer circuit board from multiple layers of copper interleaved with multiple layers of a composite material, as disclosed in U.S. Pat. No. 4,513,055, also to the present inventor. The composite material is fabricated from a woven fabric that is embedded in a resin matrix. The fabric is woven from yarns of two different materials, one having a negative coefficient of thermal expansion and the other having a positive coefficient of thermal expansion. The proportions of the two materials are selected to provide a circuit board having a desired coefficient of thermal expansion. U.S. Pat. No. 4,414,264 to Olson discloses another multilayer circuit board utilizing multiple layers of a woven-fabric composite material.

All of these techniques, which tailor the coefficient of thermal expansion of the multilayer printed circuit board to that of the ceramic chip carrier, rely on either a conductive metal, such as graphite, or a woven-fabric composite material to reduce the coefficient of thermal expansion of the circuit board. However, each of these techniques has certain disadvantages. Accordingly, there still exists a need for an improved multilayer printed circuit board for ceramic chip carriers. The present invention clearly fulfills this need.

SUMMARY OF THE INVENTION

The present invention resides in a multilayer printed circuit board in which multiple layers of a composite material, fabricated by the lay-up of an aramid fiber tape, are employed to provide a circuit board with a desired coefficient of thermal expansion. More specifically, the composite layers are copper clad layers, the copper being appropriately patterned as dictated by the electrical components to be mounted on the circuit board. The composite layers are bonded together with a suitable insulating adhesive layer and electrical connections between the vaious copper traces are made with through-holes in the circuit board.

Each composite layer includes two outer layers and two inner layers of an aramid fiber tape. The aramid fiber tape is oriented in the X direction in the outer layers and in the Y direction in the inner layers to provide a composite layer having a low coefficient of thermal expansion in both the X and Y directions. The inner and outer layers are arranged symmetrically about the centerline of the composite layer to prevent bending of the composite layer during temperature changes.

The aramid fiber tape is fabricated by arranging a single layer of aramid fibers in a parallel fashion to form fiber strips. The strips can be of any width, but should be as wide as possible for ease of fabrication. The strips are then coated with a resin and heated to a semi-cured or "B" stage to form the aramid fiber tape. The aramid fiber tape is then laid up one layer at a time in the desired fiber orientation to form the composite layer. The composite layer is coated with copper, either with a copper foil or by using a copper bath and a conventional electroless process, and the copper-coated composite layer is then etched to form the desired electrical patterns. The composite layers are then stacked and cured.

Tape lay-up of aramid fibers provides a composite layer having a lower thermal coefficient of expansion than a composite layer fabricated from woven aramid fibers. For example, in one test involving an aramid fiber impregnated with an epoxy resin, results showed a coefficient of thermal expansion in the range of 1.4 to $2.3 \times 10^{-6}$ in/in/°C. for tape lay-up as compared with a coefficient of thermal expansion of 4 to $7 \times 10^{-6}$ in/in/°C. for the same material in woven form. Degradation in the tensile modulus of elasticity caused by the over and under characteristics of woven fabrics is also eliminated by tape lay-up, thus providing a circuit board with better mechanical strength. In addition, tape lay-up reduces the amount of resin required to fabricate the circuit board from about 60% of the board to about 40%, thus reducing the thickness of the board. Finally, tape lay-up eliminates the need for twisting the aramid fibers into yarns and then weaving the yarns, thus reducing the cost of the circuit board.

It will be appreciated from the foregoing that the present invention represents a significant advance in the field of multilayer printed circuit boards. In particular, the invention provides a circuit board having a coefficient of thermal expansion that can be accurately matched to that of ceramic chip carriers. Moreover, the circuit board has excellent mechanical strength, a low dielectric constant and good thermal conductivity. Other aspects and advantages of the invention will become apparent from the following more detailed description, taken in conjunction with the accompanying drawings.

DESCRIPTION OF THE PREFERRED EMBODIMENTS

Figure 1:
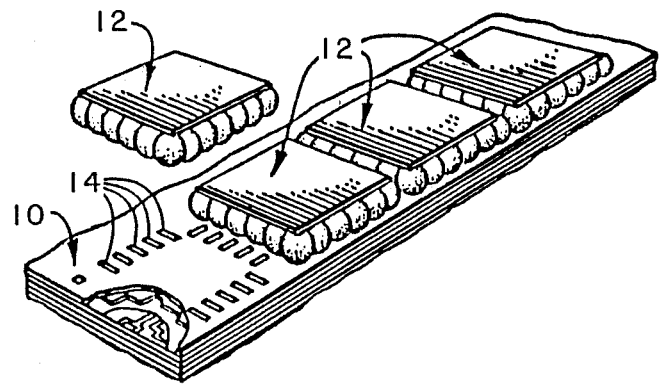
FIG. 1 is a simplified perspective view showing four chip carriers mounted on a multilayer printed circuit board.

As shown in the drawings for purposes of illustration, the present invention is principally concerned with multilayer printed circuit boards. There are four desirable properties of circuit boards, especially those used to support ceramic chip carriers. First, the circuit board should have a relatively low dielectric constant to facilitate transmission of signals over relatively long distances. Second, the coefficient of thermal expansion of the circuit board should be controllable to a high degree to match the coefficient of thermal expansion of the ceramic chip carriers. Third, the circuit board should be a good thermal conductor to dissipate heat generated by the ceramic chip carriers. Finally, the circuit board should have a high tensile modulus of elasticity for good mechanical strength. Unfortunately, all of these desired characteristics cannot be found in a single material.

FIG. 1 shows a multilayer circuit board 10 that is used for supporting four leadless ceramic chip carriers 12. Each chip carrier 12 houses an IC chip and has contact pads around the periphery of its bottom face to which input/output leads of the various circuits within the IC chip are connected. The contact pads are attached to respective contact pads 14 on top of the circuit board 10 by a reflow soldering process. Any mismatch between the coefficient of thermal expansion of the chip carrier 12 and the coefficient of thermal expansion of the circuit board 10 can result in damage to these electrical connections.

Figure 2:
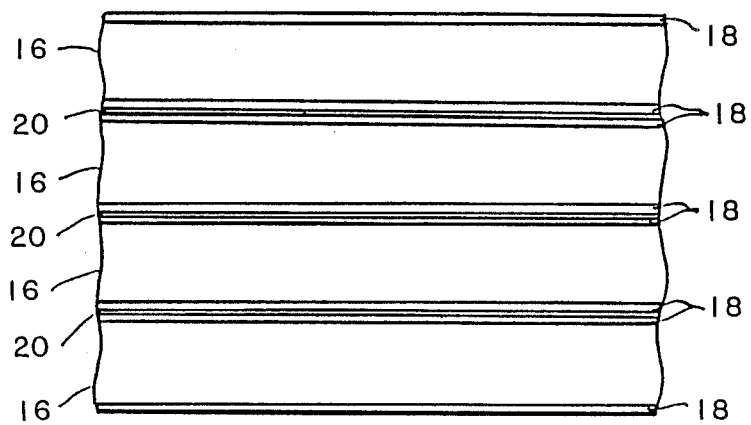
FIG. 2 is a fragmentary sectional view of the composite layers that form a multilayer circuit board made in accordance with the present invention.

In accordance with a presently preferred embodiment of the invention, as illustrated in FIG. 2, the circuit board 10 includes a plurality of layers 16 of a composite material fabricated by the lay-up of an aramid fiber tape. The composite layers 16 are copper clad layers, as indicated at 18, the copper being appropriately patterned as dictated by the design of the IC chips 12 mounted on the circuit board 10. The composite layers 16 are bonded together with a suitable insulating adhesive layer 20 and electrical connections between the various copper traces are made with through-holes in the circuit board 10.

Figure 3:
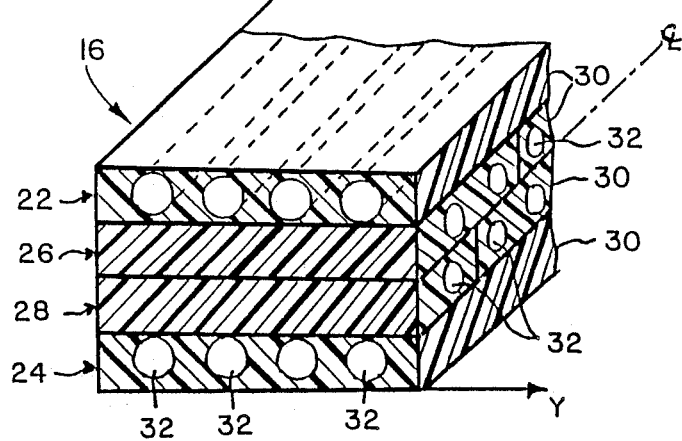
FIG. 3 is a fragmentary sectional view showing one of the composite layers.

As shown in FIG. 3, each composite layer 16 includes two outer layers 22, 24 and two inner layers 26, 28 of an aramid fiber tape 30. The aramid fiber tape 30 is oriented in the X direction in the outer layers 22, 24 and in the Y direction in the inner layers 26, 28 to provide a composite layer 16 having a low coefficient of thermal expansion in both the X and Y directions. The layers 22, 24, 26, 28 are arranged symmetrically about the centerline of the composite layer 16 to prevent bending of the composite layer during temperature changes.

The aramid fiber tape 30 is fabricated by arranging a single layer of aramid fibers 32 in a parallel fashion to form fiber strips. The strips can be of any width, but should be as wide as possible for ease of fabrication. The strips are then coated with a resin and heated to a semi-cured or "B" stage to form the aramid fiber tape 30. The aramid fiber tape 30 is then laid up one layer at a time in the fiber orientation shown in FIG. 3 to form the composite layer 16. The composite layer is coated with copper, either with a copper foil or by using a copper bath and a conventional electroless process, and the copper-coated composite layer is then etched to form the desired electrical patterns. The composite layers 16 are then stacked as shown in FIG. 2 and cured.

In the presently preferred embodiment of the invention, the aramid fiber 32 is preferably an aramid fiber manufactured by E.I. du Pont de Nemours & Co., Inc. and sold under the trademark Kevlar 108. The resin can be an epoxy or polyimide resin. The insulating adhesive layer 20 can be a single layer of aramid fibers impregnated with a resin, such as one of the layers 22, 24, 26, 28, or the adhesive layer 20 can be a single layer of woven aramid fibers impregnated with a resin.

Tape lay-up of aramid fibers 32 provides a composite layer 16 having a lower thermal coefficient of expansion than a composite layer fabricated from woven aramid fibers. For example, in one test involving Kevlar 108 yarn impregnated with an epoxy resin, results showed a coefficient of thermal expansion in the range of 1.4 to $2.3 \times 10^{-6}$ in/in/°C. for tape lay-up as compared with a coefficient of thermal expansion of 4 to $7 \times 10^{-6}$ in/in/°C. for the same material in woven form. Degradation in the tensile modulus of elasticity caused by the over and under characteristics of woven fabrics is also eliminated by tape lay-up, thus providing a circuit board with better mechanical strength. In addition, tape lay-up reduces the amount of resin required to fabricate the circuit board from about 60% of the board to about 40%, thus reducing the thickness of the board. Finally, tape lay-up eliminates the need for twisting the aramid fibers into yarns and then weaving the yarns, thus reducing the cost of the circuit board.

It will be appreciated from the foregoing that the present invention represents a significant advance in the field of multilayer printed circuit boards. In particular, the invention provides a circuit board having a coefficient of thermal expansion that can be accurately matched to that of ceramic chip carriers. Moreover, the circuit board has excellent mechanical strength, a low dielectric constant and good thermal conductivity. Although a preferred embodiment of the invention has been described in detail for purposes of illustration, various modifications may be made without departing from the spirit and scope of the invention. For example, although the composite layers of the present invention have been described as being fabricated from aramid fibers, fibers of any nonconductive material having a low or negative coefficient of thermal expansion may be employed. The nonconductive material should have a coefficient of thermal expansion that is less than that of the electrical components to be mounted on the circuit so that when the composite material is combined with the copper patterns, which have a higher coefficient of thermal expansion than the components, the coefficient of the circuit board can be matched to that of the electrical components. In addition, copper can be replaced by any conductive metal. Accordingly, the invention is not to be limited except as by the following claims.

I claim:

1. A method for fabricating a multilayer printed circuit board, comprising the steps of:
    forming a plurality of layers of a composite material by lay-up of an aramid fiber tape, each composite layer including a plurality of layers of the aramid fiber tape;
    plating at least one side of some of the composite layers with a layer of copper;
    etching the copper layers with predefined circuit patterns; and
    laminating the composite layers with insulating adhesive layers to form a printed circuit board having a coefficient of thermal expansion that is approximately equal to that of the electrical components to be mounted on the circuit board.

2. A method for fabricating a multilayer printed circuit board as set forth in claim 1, wherein each composite layer includes two outer layers and two inner layers of the aramid fiber tape, the aramid fiber tape being oriented in the X direction in the outer layers and in the Y direction in the inner layers.

3. A method for fabricating a multilayer printed circuit board as set forth in claim 1, wherein the aramid fiber tape is a single layer of aramid fibers coated with a resin and heated to a semi-cured stage.

4. A method for fabricating a multilayer printed circuit board as set forth in claim 1, wherein the insulating adhesive layers are each a single layer of aramid fiber tape.

5. A method for fabricating a multilayer printed circuit board as set forth in claim 1, wherein the insulating adhesive layers are each a single layer of woven aramid fibers impregnated with a resin.

6. A method for fabricating a multilayer printed circuit board as set forth in claim 3, wherein the resin is an epoxy resin.

7. A method for fabricating a multilayer printed circuit board as set forth in claim wherein the resin is a polyimide resin.

8. A method for fabricating a multilayer printed circuit board, comprising the steps of:
    forming a plurality of layers of a composite material by lay-up of a fiber tape, each composite layer including a plurality of layers of the fiber tape;
    plating at least on side of some of the composite layers with a later of conductive metal;
    etching the metal layers with predefined circuit patterns; and
    laminating the composite layers with insulating adhesive layers to form a printed circuit board having a coefficient of thermal expansion that is approximately equal to that of the electrical components to be mounted on the circuit board.

9. A method for fabricating a multilayer printed circuit board as set forth in claim 8, wherein each composite layer includes two outer layers and two inner layers of the fiber tape, the fiber tape being oriented in the X direction in the outer layers and in the Y direction in the inner layers.

10. A method for fabricating a multilayer printed circuit board as set forth in claim 8, wherein the fiber tape is a single layer of fibers coated with a resin and heated to a semi-cured stage.

11. A method for fabricating a multilayer printed circuit board as set forth in claim 8, wherein the insulating adhesive layers are each a single layer of fiber tape.

12. A method for fabricating a multilayer printed circuit board as set forth in claim 8, wherein the insulating adhesive layers are each a single layer of woven fibers impregnated with a resin.

13. A method for fabricating a multilayer printed circuit board as set forth in claim 10, wherein the fiber is an aramid fiber.

14. A method for fabricating a multilayer printed circuit board as set forth in claim 10, wherein the resin is an epoxy resin.

15. A method for fabricating a multilayer printed circuit board as set forth in claim 10, wherein the resin is a polyimide resin.

16. A method for fabricating a multilayer printed circuit board as set forth in claim 8, wherein the conductive metal is copper.

* * * * *